(12) United States Patent
Kapusta et al.

(10) Patent No.: US 8,508,257 B2
(45) Date of Patent: Aug. 13, 2013

(54) NOISE CANCELLATION SYSTEM AND METHOD FOR AMPLIFIERS

(75) Inventors: Ronald A. Kapusta, Bedford, MA (US);
Colin Lyden, County Cork (IE);
Haiyang Zhu, Wilmington, MA (US)

(73) Assignee: Analog Devices, Inc., Norwood, MA (US)

( * ) Notice: Subject to any disclaimer, the term of this patent is extended or adjusted under 35 U.S.C. 154(b) by 194 days.

(21) Appl. No.: 13/096,283

(22) Filed: Apr. 28, 2011

(65) Prior Publication Data

US 2012/0274363 A1  Nov. 1, 2012

(51) Int. Cl.
*G11C 27/02* (2006.01)
*H03K 5/00* (2006.01)
*H03K 17/00* (2006.01)

(52) U.S. Cl.
USPC ............................................. 327/94; 327/96

(58) Field of Classification Search
USPC ................................. 327/306–307, 91–97, 554
See application file for complete search history.

(56) References Cited

U.S. PATENT DOCUMENTS

| 5,215,081 A | 6/1993 | Ostroff et al. |
| 5,281,860 A * | 1/1994 | Krenik et al. ................. 327/407 |
| 5,351,050 A * | 9/1994 | Thompson et al. ........... 341/143 |
| 6,107,871 A * | 8/2000 | Shin ............................... 327/554 |
| 6,429,697 B1 | 8/2002 | Amazeen et al. |
| 7,298,151 B2 | 11/2007 | Kapusta, Jr. et al. |
| 7,800,427 B2 * | 9/2010 | Chae et al. .................... 327/337 |
| 8,179,183 B2 * | 5/2012 | Costa-Domingues et al. ............................. 327/337 |
| 2006/0071709 A1 | 4/2006 | Maloberti et al. |

OTHER PUBLICATIONS

PCT International Search Report for PCT/US12/030074 mailed on Jun. 29, 2012.

* cited by examiner

*Primary Examiner* — Quan Tra

(74) *Attorney, Agent, or Firm* — Kenyon & Kenyon LLP

(57) ABSTRACT

An architecture of an integrated circuit allows for the canceling of noise sampled on a capacitor in the integrated circuit, after an input signal has already been sampled. Thermal noise correlated with an arbitrary input signal may be canceled after selectively controlling a plurality of switching devices during a sequence of clock phases. An auxiliary capacitor may be used to store a voltage equal to the thermal noise and enable the cancellation of the thermal noise from the sampled signal in conjunction with a noise cancellation unit.

17 Claims, 3 Drawing Sheets

NOISE CANCELLATION SYSTEM AND METHOD FOR AMPLIFIERS

FIELD OF THE INVENTION

The present invention relates to a process for canceling noise sampled on a capacitor in an integrated circuit. The present invention further relates to a method for canceling thermal noise in high-accuracy and high-resolution integrated circuits. The present invention further relates to an architecture for an integrated circuit that cancels noise accompanying a sampled input signal, after the input signal has been sampled.

BACKGROUND INFORMATION

The implementation of sampling processes on integrated circuits often requires the use of sampling networks or switched capacitor circuits. Switched capacitor circuits allow for discrete time signal processing by applying an input signal to a capacitor when a connected switch is closed. FIG. 1 illustrates a standard capacitive sampling circuit. When switch 20 is closed during the phase φ1, the input signal is applied and a corresponding charge is stored on capacitor 10 that is proportional to the input signal, and this charge is held on capacitor 10 when switch 20 is opened.

While basic switched capacitor circuits such as that illustrated in FIG. 1 are useful in implementing sampling processes, they have a number of drawbacks. Sampling an input signal in a switched capacitor circuit will not only sample the intended input signal, but any accompanying thermal noise. This noise is primarily produced by the switch, such as switch 20 in FIG. 1, in the switched capacitor circuits, and is particularly problematic when used in conjunction with small capacitors. When designing integrated circuits using switched capacitor circuits, consideration must be made for the presence of the sampled noise, especially in integrated circuits that require a high accuracy (such as high-accuracy sample and hold circuits) or high resolution (such as high-resolution data converters). Consideration, in particular, must be made to account for the power produced by the sampled noise. If switch 20 is represented by a simple resistive element having a resistance of $R_{ON}$, the thermal noise power of the sampled noise in a switched capacitor circuit can be expressed by Equation (i):

$$\text{noise\_power} = (4kTR_{ON}) * \left(\frac{1}{R_{ON}C} * \frac{1}{2\pi} * \frac{\pi}{2}\right), \quad (i)$$

where k=Boltzmann's constant, T=the absolute temperature in Kelvin, $R_{ON}$=the equivalent resistance of the switching device, and C=the capacitance of the sampling capacitor.

Equation (i) may be further simplified into equation (ii):

$$\text{noise\_power} = \frac{kT}{C}. \quad (ii)$$

Previous techniques for designing integrated circuits have concentrated on reducing the magnitude of the noise sampled, such as in U.S. Pat. No. 7,298,151 ("the 151 patent"). FIG. 2 illustrates a capacitive sampling circuit with a hold amplifier to reduce sampling noise, as described in the '151 patent. During phase φ1, switches 20 and 22 are closed, connecting capacitor 10 to the input at the bottom plate. When switch 20 is closed, the input signal is applied and stored on capacitor 10. The closing of switch 22 allows for setting a DC potential voltage on the top plate of capacitor 10, allowing for the setting of a charge at node S1, as illustrated in FIG. 2. The charge on capacitor 10 will therefore be proportional to the input voltage less the DC potential at S1. During φ2, switch 21 is closed, and the charge at S1 is frozen. Amplifier 30 is connected to capacitor 10 at node S1, and is used to buffer the sampled input voltage during the hold phase, φ2. During this hold phase, switch 23 is closed, creating a feedback loop for amplifier 30 through capacitor 12. This arrangement, as described in the '151 patent, allows for the sampled noise to effectively have a power that is less than $$\frac{kT}{C}.$$

While this process allows for the reduction of the noise in the integrated circuit, it does not provide for an actual cancellation of the noise in the circuit. Thus, sampled noise will continue to be present in the system and add to the power output of the integrated circuit.

Other previous configurations have, instead of trying to reduce the noise sampled, attempted to reduce or cancel noise on a capacitor reset to a DC voltage in the designed integrated circuit or used correlated double sampling in imagers that relied on noise being present before a signal is sampled. None of these other previously implemented systems have allowed for an actual cancellation of the noise component from a sampled signal after a sample has already been taken.

Thus there remains a need in the art for a system and a process that cancels the noise sampled on a sampling capacitor after an input signal has already been sampled.

DETAILED DESCRIPTION

The subject invention will now be described in detail for specific preferred embodiments of the invention, it being understood that these embodiments are intended only as illustrative examples and the invention is not to be limited thereto.

In switched capacitor circuits used to sample various input signals, cancellation of the accompanying noise component with an input signal may be done by sampling an arbitrary input signal containing the thermal noise and canceling the thermal noise after the sample is taken by selectively controlling a plurality of switching devices during a sequence of clock phases. Embodiments of the present invention may provide an input capacitor and a noise cancellation unit. A noise cancellation unit may include a buffer, an auxiliary capacitor, and additional switches. An auxiliary capacitor may be used to store a voltage equal to the thermal noise to enable cancellation of the thermal noise from the sampled signal. Embodiments of the present invention may also provide for a noise cancellation unit that includes a pair of amplifiers with a negative feedback loop that may control a gain of the circuit to cancel out the thermal noise in the sampled signal.

Figure 1:
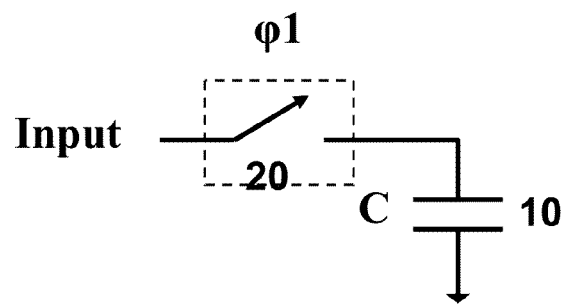
FIG. 1 is a diagram of a standard capacitive sampling circuit.
Figure 2:
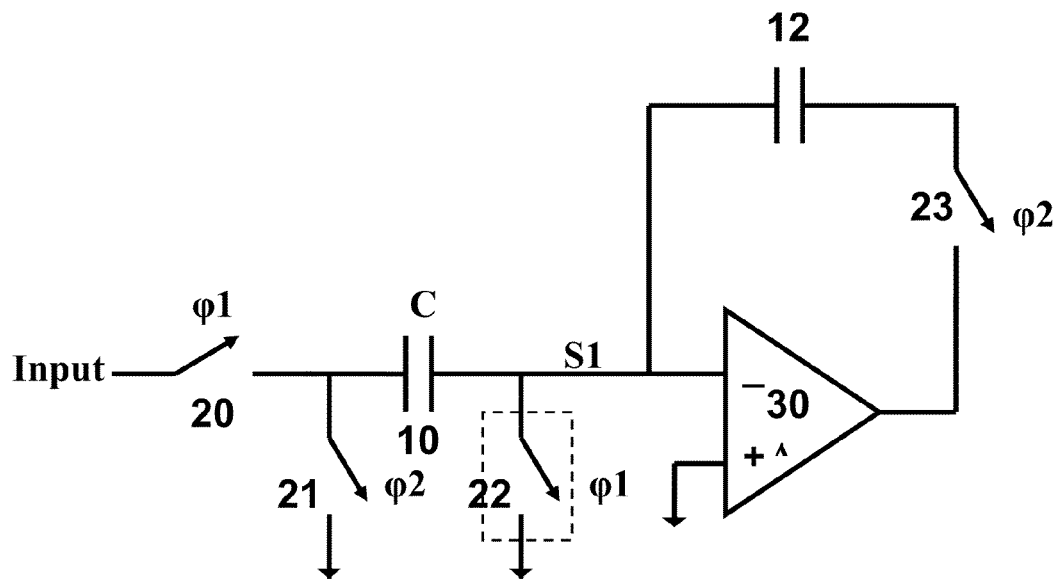
FIG. 2 is a diagram of a capacitive sampling circuit with a hold amplifier to reduce sampling noise.
Figure 3:
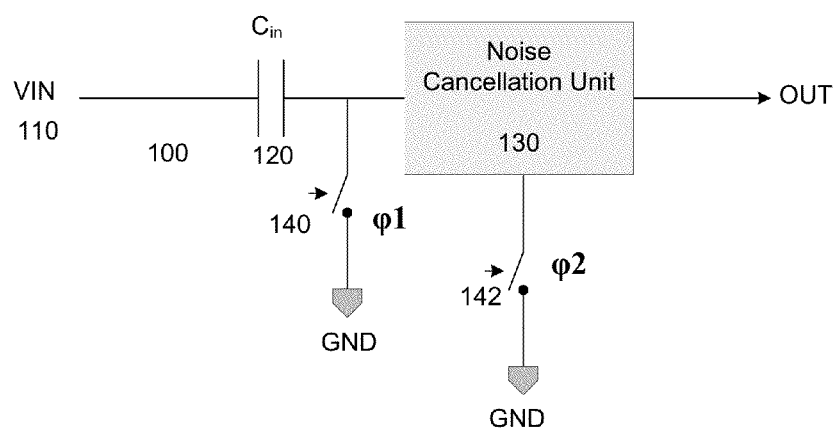
FIG. 3 is a diagram of an integrated circuit with a noise cancellation unit to cancel out the thermal noise from the sampled input signal, according to the present invention.

FIG. 3 illustrates a diagram of an integrated circuit with a noise cancellation unit to cancel out the thermal noise from the sampled input signal of the present invention. Integrated circuit 100 may include an input capacitor, $C_{in}$ 120. The bottom plate of input capacitor 120 may be connected to an input for integrated circuit 100, where an input voltage, VIN, may be applied. The top plate of input capacitor 120 may be connected to ground, or a constant voltage, through switching device 140 and to noise cancellation unit 130. Switching device 140 may be connected to the top plate of capacitor 140 and the input to noise cancellation unit 130 at the input terminal of the switching device. The output terminal of switching device 140 may be connected to ground or a constant voltage. In alternative embodiments, switching device 140 may be connected to the top plate of capacitor 140 and noise cancellation unit 130 at the output terminal of the switching device, and to ground at the input terminal of the switching device. Switching device 140 may be closed during clock phase φ1, which may correspond to a phase during the sampling mode.

Noise cancellation unit 130 may be connected to input capacitor 120 at the input of noise cancellation unit 130. The output of noise cancellation unit 130 may correspond to the output of the sampling segment of integrated circuit 100. Noise cancellation unit 130 may also be connected to ground or a constant voltage through switching device 142. Switching device 142 may be connected to noise cancellation unit 130 at the input terminal of the switching device, and to ground at the output terminal of the switching device, as illustrated in FIG. 3. In other embodiments, switching device 142 may be connected to noise cancellation unit 130 at the output terminal of the switching device, and to ground or a constant voltage at the input terminal of the switching device.

During operation, an input signal, VIN, may be applied to the bottom plate of input capacitor 120. Switching device 140 may be closed during clock phase φ1, connecting the top plate of input capacitor 120 to ground. When switching device 140 is opened, a charge may be maintained on capacitor 120, and VIN may be stored on capacitor 120. The signal sampled on input capacitor 120 may also contain thermal noise that accompanied with VIN when the input voltage was sampled and stored on the capacitor. VIN and the sampled thermal noise may be output to noise cancellation unit 130. During clock phase φ2, switching device 142 may close, connecting noise cancellation unit 130 to ground. During this clock phase, noise cancellation unit 130 may cancel the sampled thermal noise. Noise cancellation unit 130 may output a signal that correlates to VIN, but does not contain any of the sampled thermal noise.

Figure 4:
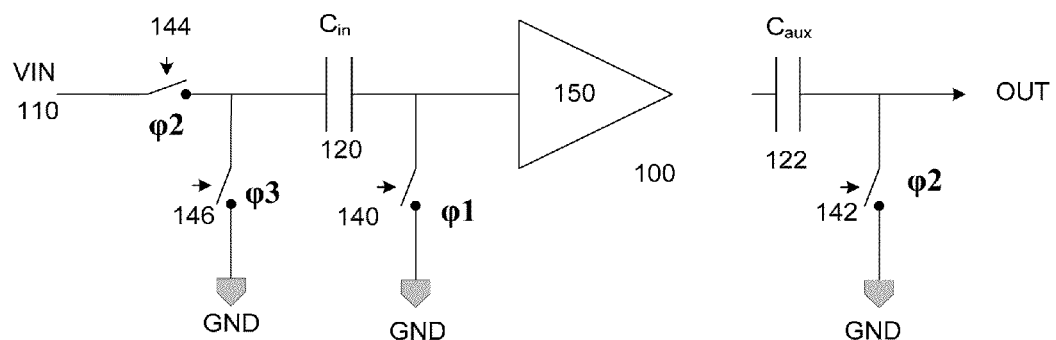
FIG. 4 is a diagram of an integrated circuit with sample and hold amplifier functionality to cancel out the thermal noise from the sampled input signal, according to the present invention.

FIG. 4 illustrates a diagram of an integrated circuit with sample and hold amplifier functionality to cancel out the thermal noise from the sampled input signal of the present invention. Integrated circuit 100 may include an input capacitor, $C_{in}$ 120. The bottom plate of input capacitor 120 may be selectively connected to an input for integrated circuit 100, through switching device 144. Switching device 144 may close during clock phase φ2, and may be connected to the input of integrated circuit 100 at the input terminal of the switching device. Switching device 144 may be connected to the bottom plate of input capacitor 120 at the output terminal of the switching device.

The bottom plate of input capacitor 120 may alternately be connected to ground or a constant voltage through switching device 146. Switching device 146 may be selectively closed during clock phase φ3. Switching device 146 may be connected to the bottom plate of input capacitor 120 at the input terminal of the switching device. Switching device 146 may also be connected at its input terminal to the output terminal of switching device 144.

The top plate of input capacitor 120 may be connected to ground or a constant voltage through switching device 140 and to buffer 150. Switching device 140 may be connected to the top plate of input capacitor 120 and the input terminal of buffer 150 at the input terminal of the switching device. The output terminal of switching device 140 may be connected to ground or a constant voltage. In alternative embodiments, switching device 140 may be connected to the top plate of input capacitor 120 and buffer 150 at the output terminal of the switching device, and to ground at the input terminal of the switching device. Switching device 140 may be closed during clock phase φ1, which may correspond to a phase during the sampling mode.

Integrated circuit 100 may also include an auxiliary capacitor, $C_{aux}$ 122. Buffer 150, auxiliary capacitor 122, and switching device 142 may make up noise cancellation unit 130. The output terminal of buffer 150 may be connected to the bottom plate of auxiliary capacitor 122. The voltage at the top plate of auxiliary capacitor 122 may correspond to the output of the sampling segment of integrated circuit 100. The top plate of auxiliary capacitor 122 may also be connected to ground through switching device 142. Switching device 142 may be connected to the top plate of auxiliary capacitor 122 at the input terminal of the switching device, and to ground or a constant voltage at the output terminal of the switching device, as illustrated in FIG. 4. In other embodiments, switching device 142 may be connected to auxiliary capacitor 122 at the output terminal of the switching device, and to ground at the input terminal of the switching device.

Figure 5:
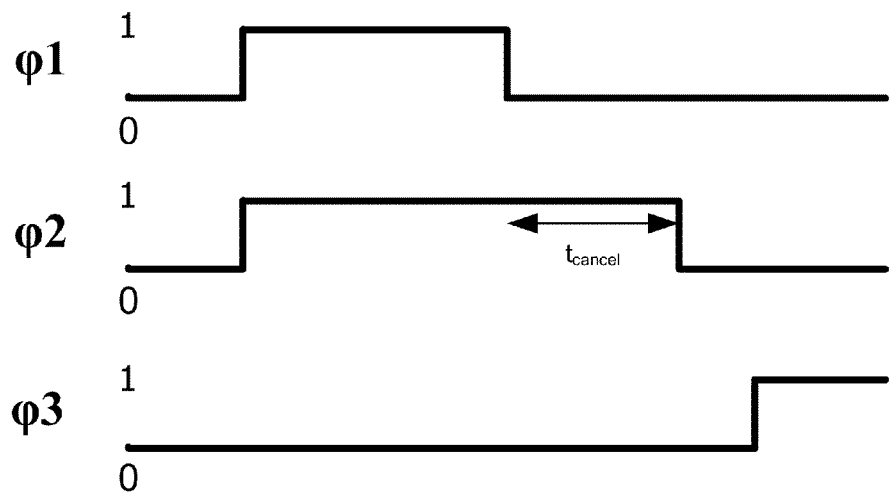
FIG. 5 is a timing diagram of the clock phases of the integrated circuit, according to the present invention.

During operation, integrated circuit 100 may operate in accordance to designated clock phases φ1, φ2, and φ3. FIG. 5 illustrates the timing of the various clock phases. Switching device 140 may close first during clock phase φ1, connecting the top plate of input capacitor 120 to ground. During clock phase φ2, switching device 144 may be closed, connecting the input of integrated circuit 100 to input capacitor 120. An input signal, VIN, may be applied to the bottom plate of input capacitor 120 and the input signal may be sampled for the rest of clock phase φ1. Switching device 142 may also be closed during clock phase φ2, connecting the top plate of auxiliary capacitor 122 to ground.

When switching device 140 is opened after φ1, a charge may be maintained on capacitor 120, and VIN may be stored on capacitor 120. The top plate of input capacitor 120 may be at a voltage different from ground due to the presence of the thermal noise that was simultaneously sampled when VIN was stored on input capacitor 120. The voltage at the top plate of input capacitor 120 corresponding to the thermal noise may be output to buffer 150, which may buffer the voltage onto the bottom plate of auxiliary capacitor 122. The top plate of auxiliary capacitor 122 may remain at ground for the duration of clock phase φ2 as switching device 142 remains closed. The voltage sampled on auxiliary capacitor 122 may be equal to the thermal noise sampled on input capacitor 120, representing the voltage potential at the top plate of input capacitor 120, and additional noise added from switching device 142. The additional noise added from switching device 142 may be negated by choosing a larger capacitance for auxiliary capacitor 122. A selection of a large capacitance for auxiliary capacitor 122 may effectively reduce thermal noise produced by switching device 142. Selecting a large capacitance for auxiliary capacitor 122 may not add an additional load to the input to integrated circuit 100 because auxiliary circuit 122 is not driven by VIN.

As illustrated by FIG. 5, clock phases φ1 and φ2 may overlap. Clock phase φ1 may end before clock phase φ2 ends. The period during which clock phase φ2 extends beyond clock phase φ1 may represent, $t_{cancel}$, the time period after which switching device 140 is opened and the sampled thermal noise from the top plate of input capacitor 120 is buffered onto auxiliary capacitor 122.

During clock phase φ3, switching device 146 may close. The closure of switching device 146 may short the bottom plate of input capacitor 120 to ground. Shorting input capacitor 120 to ground may change the potential voltage at the top plate of auxiliary capacitor 122 to −VIN. Integrated circuit 100 may then produce VIN at the output of the sampling stage of the circuit, without the presence of any sampled thermal noise.

Figure 6:
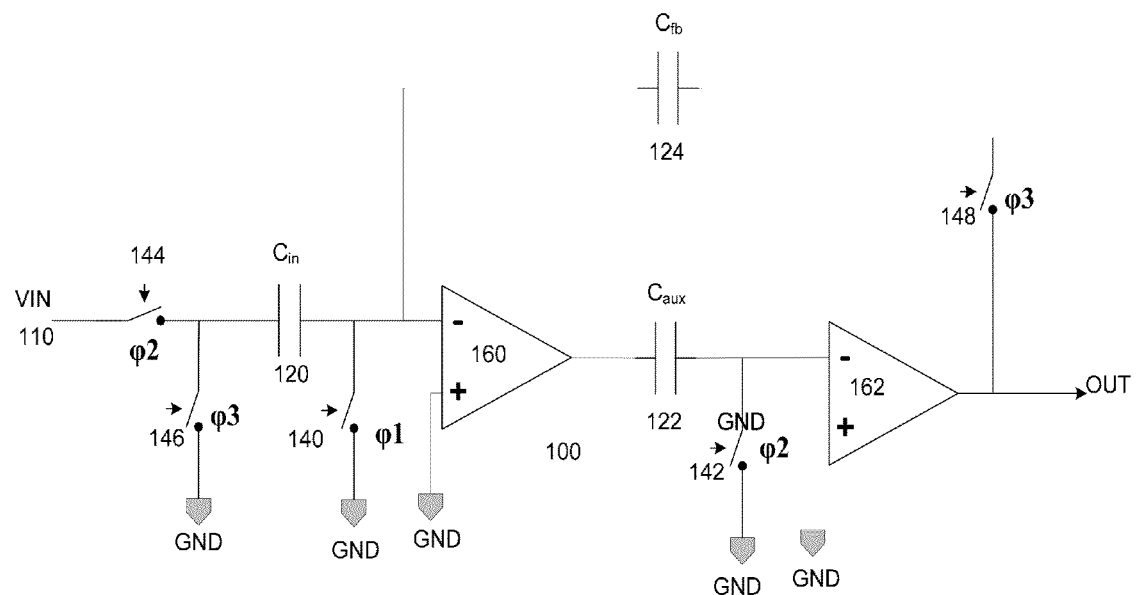
FIG. 6 is a diagram of an integrated circuit with a controlled sample and hold amplifier gain to cancel out the thermal noise from the sampled input signal, according to the present invention.

FIG. 6 illustrates a diagram of an integrated circuit with a controlled sample and hold amplifier gain to cancel out the thermal noise from the sampled input signal of the present invention. Integrated circuit 100 may include an input capacitor, $C_{in}$ 120. The bottom plate of input capacitor 120 may be selectively connected to an input for integrated circuit 100, through switching device 144. Switching device 144 may close during clock phase φ2, and may be connected to the input of integrated circuit 100 at the input terminal of the switching device. Switching device 144 may be connected to the bottom plate of input capacitor 120 at the output terminal of the switching device.

The bottom plate of input capacitor 120 may alternately be connected to ground or a constant voltage through switching device 146. Switching device 146 may be selectively closed during clock phase φ3. Switching device 146 may be connected to the bottom plate of input capacitor 120 at the input terminal of the switching device. Switching device 146 may also be connected at its input terminal to the output terminal of switching device 144.

The top plate of input capacitor 120 may be connected to ground or a constant voltage through switching device 140 and to the inverting input of amplifier 160. Switching device 140 may be connected to the top plate of input capacitor 120 and the inverting input terminal of amplifier 160 at the input terminal of the switching device. The output terminal of switching device 140 may be connected to ground or a constant voltage. In alternative embodiments, switching device 140 may be connected to the top plate of input capacitor 120 and the inverting input of amplifier 160 at the output terminal of the switching device, and to ground at the input terminal of the switching device. Switching device 140 may be closed during clock phase φ1, which may correspond to a phase during sampling.

Integrated circuit 100 may also include a pair of amplifiers, 160 and 162. Amplifiers 160 and 162 may each have a open-loop gain that may amplify the input to the respective amplifier, although the overall closed-loop gain of integrated circuit 100 may be controlled by the connected feedback loop, as illustrated in FIG. 6. The inverting input of amplifier 160 may be connected to the top plate of input capacitor 120 and selectively to ground or a constant voltage through switching device 140. The non-inverting input terminal of amplifier 160 may be connected to ground. Amplifier 160 may be connected to the bottom plate of auxiliary capacitor, $C_{aux}$ 122.

The top plate of auxiliary capacitor 122 may be connected to ground through switching device 142 and to the inverting input terminal of amplifier 162. Switching device 142 may be connected to the top plate of auxiliary capacitor 122 and to the inverting input of amplifier 162 at the input terminal of the switching device, and to ground or a constant voltage at the output terminal of the switching device, as illustrated in FIG. 6. In other embodiments, switching device 142 may be connected to auxiliary capacitor 122 and the inverting input of amplifier 162 at the output terminal of the switching device, and to ground at the input terminal of the switching device.

The non-inverting input terminal of amplifier 162 may be connected to ground or a constant voltage. The output of amplifier 162 may also correspond to the output of the sampling segment of integrated circuit 100. Amplifier 162 may increase the sample and hold amplifier gain and isolate auxiliary capacitor 124 from the output. A feedback loop may also be connected between the output of amplifier 162 and the inverting input of amplifier 160. Switching device 148 may connect the output of amplifier 162 to feedback capacitor, $C_{fb}$ 124, in the feedback loop. Switching device 148 may be closed during clock phase φ3.

The bottom plate of feedback capacitor 124 may be connected to the output of amplifier 162 when switching device 148 is closed. The top plate of the feedback capacitor 124 may be connected to the inverting input terminal of amplifier 160 and to the top plate of input capacitor 120; therefore the potential voltage at the top plates for the feedback capacitor 124 and the input capacitor 120 may be the same. The top plate of feedback capacitor 124 may also be connected to ground through switching device 140. Feedback may only be provided through the feedback loop during clock phase φ3, when switching device 148 is closed. The presence of the feedback loop may allow for controlling the sample and hold amplifier gain of integrated circuit 100.

During operation, integrated circuit 100 may operate in accordance to designated clock phases φ1, φ2, and φ3. Switching device 140 may close first during clock phase φ1, connecting the top plate of input capacitor 120 to ground. During clock phase φ2, switching device 144 may be closed, connecting the input of integrated circuit 100 to input capacitor 120. An input signal, VIN, may be applied to the bottom plate of input capacitor 120 and the input signal may be sampled for the rest of clock phase φ1. Switching device 142 may also be closed during clock phase φ2, connecting the top plate of auxiliary capacitor 122 to ground.

When switching device 140 is opened after φ1, a charge may be maintained on capacitor 120, and VIN may be stored on capacitor 120. The top plate of input capacitor 120 may be at a voltage different from ground due to the presence of the thermal noise that was simultaneously sampled when VIN was stored on input capacitor 120. The voltage at the top plate of input capacitor 120 corresponding to the sampled thermal noise may be output to amplifier 160, which may amplify this signal onto the bottom plate of auxiliary capacitor 122. Amplifier 160 may also reduce the impact of additional noise added from switching device 142, therefore providing that the input-referred voltage sampled on auxiliary capacitor 122 may correlate to the thermal noise sampled on input capacitor 120, with minimal additional thermal noise from switching device 142. The top plate of auxiliary capacitor 122 may remain at ground for the duration of clock phase φ2 as switching device 142 remains closed. During clock phase φ2, the applied inputs to both of the input terminals of amplifier 162 may be ground, and amplifier 162 may not output a voltage at its output.

During clock phase φ3, switching device 146 may close. The closure of switching device 146 may short the bottom plate of input capacitor 120 to ground. Due to the high gain of amplifier 162, along with the negative feedback configuration, shorting input capacitor 120 to ground may cause the charge on input capacitor 120 to transfer to feedback capacitor 124, such that the output of amplifier 162 is equal −VIN*CIN/CFB. In addition, because auxiliary capacitor 122 has stored charge that corresponds to the noise voltage sampled on input capacitor 120, none of the noise charge on input capacitor 120 will transfer to feedback capacitor 124. In this way, integrated circuit 100 may then produce −(−VIN*CIN/CFB) at the output of the sampling stage of the circuit, without the presence of any sampled thermal noise.

Several embodiments of the invention are specifically illustrated and/or described herein. However, it will be appreciated that modifications and variations of the invention are covered by the above teachings and within the purview of the appended claims without departing from the spirit and intended scope of the invention.

What is claimed is:

1. An integrated circuit for canceling thermal noise sampled during a sampling phase, the noise caused by a switch used to perform sampling of an input voltage, the integrated circuit comprising:
    an input connected to the input voltage;
    a capacitor storing a sample of the input voltage during the sampling phase, wherein the noise is also sampled on the capacitor; and
    an arrangement for noise cancellation, wherein the arrangement obtains a voltage corresponding to the noise sampled on the capacitor and cancels the noise during a hold phase using the obtained voltage.

2. An integrated circuit for canceling thermal noise sampled during a sampling phase, the noise caused by a switch used to perform sampling of an input voltage, the integrated circuit comprising:
    an input connected to the input voltage;
    a first capacitor storing a first sample of the input voltage during the sampling phase, wherein the noise is also sampled on the first capacitor; and
    a second capacitor storing a second sample, the value of the second sample being substantially equal to the value of the noise of the first sample.

3. The integrated circuit according to claim 2, wherein the value of the second sample stored on the second capacitor is used to cancel the noise of the first sample.

4. The integrated circuit according to claim 2, further comprising:
    a buffer to separate the first and the second capacitor.

5. The integrated circuit according to claim 2, further comprising:
    an amplifier to separate the first and the second capacitor.

6. The integrated circuit according to claim 5, wherein the amplifier amplifies the sampled input voltage.

7. The integrated circuit according to claim 5, wherein the amplifier cancels the noise of the first sample using the value of the second sample.

8. The integrated circuit according to claim 5, further comprising:
    an additional amplifier isolating the second capacitor from the output of the integrated circuit.

9. The integrated circuit according to claim 8, wherein the additional amplifier increases an overall gain of the integrated circuit.

10. The integrated circuit according to claim 8, further comprising:
    a feedback loop connecting the output of the additional amplifier and the input of the amplifier.

11. The integrated circuit according to claim 10, wherein the feedback loop controls an overall gain of the integrated circuit.

12. The integrated circuit according to claim 10, wherein the feedback loop includes a third capacitor.

13. A method for canceling thermal noise sampled during a sampling phase in an integrated circuit, the noise caused by a switch used to perform sampling of an input voltage, the method comprising:
    sampling the input voltage on a capacitor, the sampled input voltage including the noise;
    monitoring the noise of the sampled input voltage by a first arrangement that obtains the noise sampled on the capacitor; and
    canceling the noise during a hold phase by the first arrangement.

14. A method for canceling thermal noise sampled during sampling in an integrated circuit, the noise caused by a switch used to perform sampling of an input voltage, the method comprising:
    during a first phase, sampling the input voltage on a first capacitor, the sampled input voltage including the noise;
    during a second phase, outputting a voltage substantially equal to the noise through a buffer to a second capacitor; and
    during a third phase, transferring charge off of the first capacitor, wherein a charge corresponding to the sampled input voltage is transferred to a third capacitor, and wherein the voltage output to the second capacitor is used to prevent the noise from being transferred to the third capacitor.

15. The method according to claim 14, further comprising:
    connecting the second capacitor to a constant voltage during the first phase.

16. A method for canceling a noise component sampled during sampling in an integrated circuit, the method comprising:
    during a first phase, sampling an input voltage on a first capacitor, the sampled input voltage including the noise;
    during a second phase, amplifying a voltage corresponding to the noise through a first amplifier to a second capacitor;
    during a third phase, performing the steps of:
        (i) transferring a signal charge off of the first capacitor;
        (ii) outputting a voltage potential at the top plate of the second capacitor through a second amplifier as an output of the integrated circuit; and
        (iii) generating a feedback loop to control a gain of the integrated circuit, wherein a voltage potential at the output of the integrated circuit correlates to the sampled input voltage without the noise, multiplied by a gain factor.

17. The method according to claim 16, further comprising:
    connecting the second capacitor to the constant voltage during the first phase.

* * * * *